United States Patent
Pavier et al.

(10) Patent No.: US 7,227,198 B2
(45) Date of Patent: Jun. 5, 2007

(54) HALF-BRIDGE PACKAGE

(75) Inventors: Mark Pavier, Felbridge (GB); Ajit Dubhashi, Redondo Beach, CA (US); Norman G. Connah, Glossop (GB); Jorge Cerezo, Palos Verdes Peninsula, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/202,004

(22) Filed: Aug. 11, 2005

(65) Prior Publication Data

US 2006/0033122 A1 Feb. 16, 2006

Related U.S. Application Data

(60) Provisional application No. 60/600,503, filed on Aug. 11, 2004.

(51) Int. Cl.
*H01L 31/111* (2006.01)
*H01L 23/495* (2006.01)
*H01L 23/48* (2006.01)
*H01L 23/34* (2006.01)

(52) U.S. Cl. ............ 257/177; 257/E23.043; 257/E23.044; 257/E23.052; 257/E23.02; 257/E23.031; 257/E23.014; 257/E23.037; 257/E23.039; 257/E23.066; 257/178; 257/666; 257/698; 257/696; 257/691; 257/685; 257/723; 257/692; 257/724; 257/728; 257/676; 257/735; 257/674; 363/147; 363/132; 361/397; 361/404; 361/409; 174/260; 174/52.4

(58) Field of Classification Search ........ 257/E23.043, 257/E23.044, E23.052, E23.02, E23.031, 257/E23.014, E23.037, E23.039, E23.066, 257/E23.004, 177, 178, 666, 698, 696, 691, 257/692, 676
See application file for complete search history.

(56) References Cited

U.S. PATENT DOCUMENTS

| | | | |
|---|---|---|---|
| 5,616,955 A * | 4/1997 | Yamada et al. ............. 257/690 |
| 6,933,593 B2 * | 8/2005 | Fissore et al. ............. 257/675 |
| 6,995,467 B2 * | 2/2006 | Herfurth et al. ............ 257/724 |
| 7,042,730 B2 * | 5/2006 | Vaysse et al. ............. 361/719 |
| 7,095,099 B2 * | 8/2006 | Oliver et al. .............. 257/676 |
| 2004/0004272 A1 * | 1/2004 | Luo et al. .................. 257/666 |
| 2005/0280998 A1 * | 12/2005 | Lin et al. .................. 361/704 |

* cited by examiner

*Primary Examiner*—Alexander Oscar Williams
(74) *Attorney, Agent, or Firm*—Ostrolenk, Faber, Gerb & Soffen, LLP

(57) ABSTRACT

A semiconductor package that includes two power semiconductor dies, such as power MOSFET dies, including vertical conduction MOSFETs, arranged in a half-bridge configuration is disclosed. The package may be mounted on a split conductive pad including two isolated die pads, each die pad being electrically connected to the second power electrode of the die that is on it. The split pad may include several conductive leads, including at least one output lead electrically connected to a first electrode of the first semiconductor die on the same side of the die as the control electrode and to the second electrode of the second die located on the opposite side of the second die from the control electrode.

16 Claims, 2 Drawing Sheets

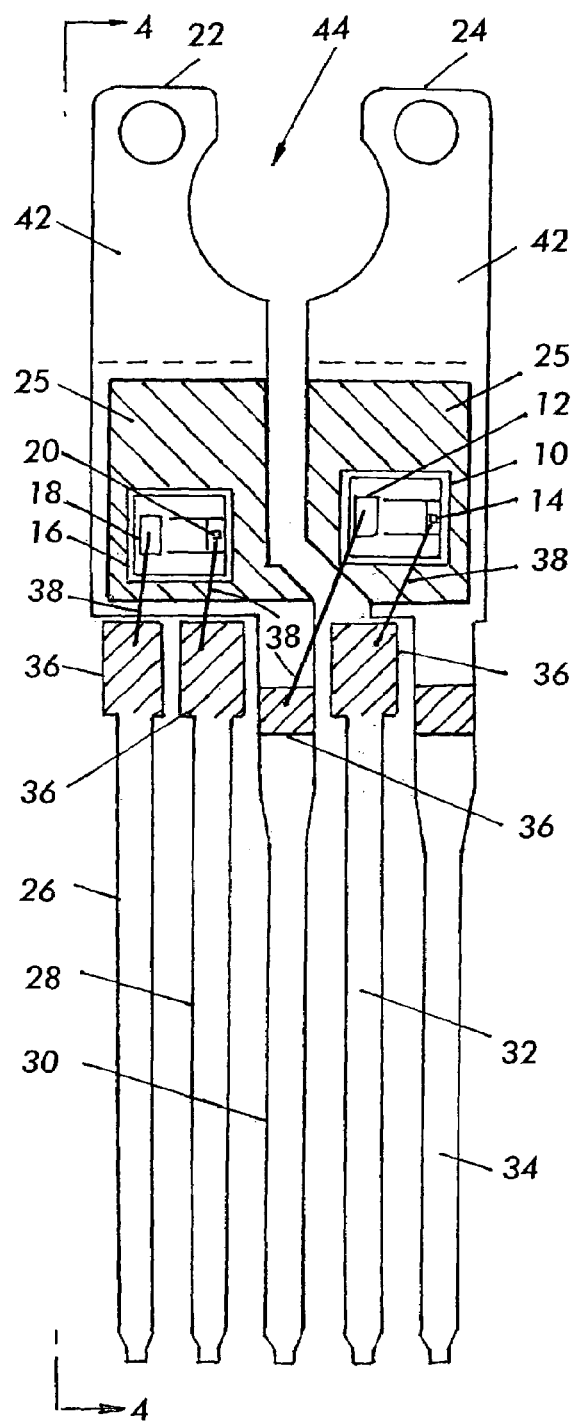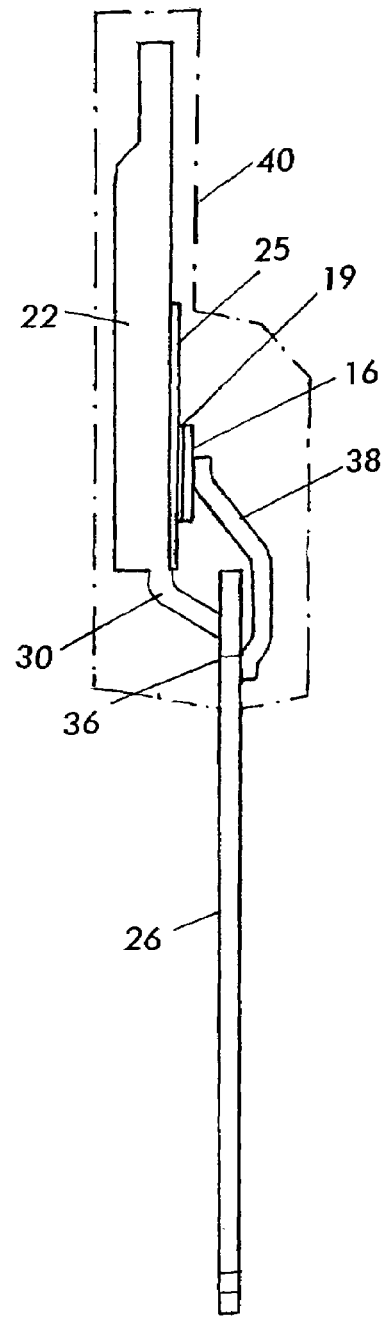
FIG. 3                    FIG. 4

HALF-BRIDGE PACKAGE

RELATED APPLICATION(S)

This application is based on and claims benefit of United States Provisional Application No. 60/600,503, filed Aug. 11, 2004, entitled COPAK HALF-BRIDGE MODULE, to which a claim of priority is hereby made and the disclosure of which is incorporated by reference. This application is related to U.S. patent application Ser. No. 10/988,443, filed Nov. 12, 2004 entitled LOW PROFILE PACKAGE HAVING MULTIPLE DIE, issued as U.S. Pat. No. 7,095,099 on Aug. 22, 2006.

BACKGROUND OF THE INVENTION

The present invention relates to semiconductor device packages and more particularly to co-packages.

Half-bridge circuits are well known in the art of power supplies. Referring to FIG. 1, a half-bridge includes two power semiconductor die connected in series. For example, a typical half bridges includes a first power MOSFET 46 (typically referred to as the high side switch or high side) having a drain side thereof electrically connectable to the bus, and the source side thereof electrically connected to the drain side of second power MOSFET 48 (typically referred to as the low side switch or the low side). The source side of second power MOSFET 48 is electrically connectable to the ground. The output 50 of the half-bridge is the point of connection of first semiconductor die 46 and second semiconductor die 48. It should be noted that half-bridge circuits are not restricted to power MOSFETs, but other power switching devices such as IGBTs, SCRs, III-nitride based power devices, or non-switching devices such as diodes can be used for forming a half-bridge.

Referring next to FIG. 2A–2B, a typical vertical conduction power MOSFET 52 includes source electrode 54 and gate electrode 56 on one side thereof, and a drain electrode 58 on an opposing surface thereof.

In a typical power semiconductor package, such as a TO-220 type package, a single power MOSFET is electrically, and mechanically mounted at the drain side thereof on a die pad by a layer of solder or the like, has its source and gate electrodes electrically connected by wirebonds or the like to external leads, and overmolded with a mold compound. Thus, to form a half-bridge using a prior art power semiconductor package at least two packages must be used. Thus, a prior art package consumes more footprint on a circuit board and would naturally exhibit higher resistance, inductance, etc. due to the extra packaging elements.

SUMMARY OF THE INVENTION

A semiconductor package according to the present invention includes two power semiconductor die arranged in a half-bridge configuration. Specifically, a split die pad configuration is used to accommodate the two die, and an output lead is used to connect to the point of connection of the two die. Thus, in the preferred embodiment of the present invention, two vertical conduction type power MOSFETs are connected to a common output lead, and the package is provided with a plurality of leads for connection to the remaining electrodes of the two power MOSFETs.

Other features and advantages of the present invention will become apparent from the following description of the invention which refers to the accompanying drawings.

BRIEF DESCRIPTION OF THE DRAWINGS

FIG. 3 shows a top plan view of a package according to the present invention having the molded housing thereof removed to illustrate the internal arrangement thereof.

FIG. 4 shows a side view of the package shown in FIG. 3 seen in the direction of arrows 4—4 and including an outline of the molded housing.

DETAILED DESCRIPTION OF THE FIGURES

Figure 1:
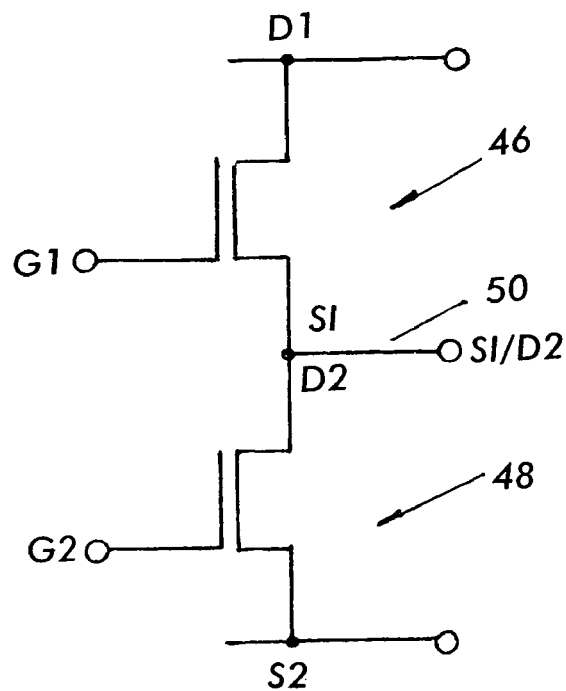
FIG. 1 illustrates a half-bridge circuit according to the prior art.
Figure 2A:
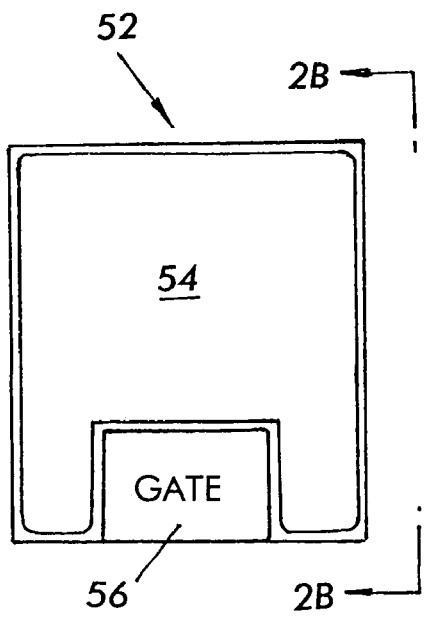
FIG. 2A shows a top plan view of a vertical conduction type power MOSFET according to the prior art.
Figure 2B:
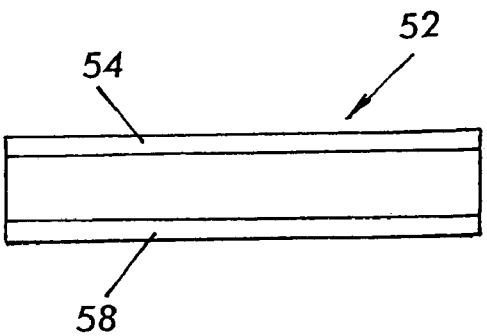
FIG. 2B shows a side plan view of a vertical conduction type power MOSFET as seen in the direction of arrows 2B—2B in FIG. 2A.

Referring to FIG. 3, a semiconductor package according to the present invention includes two power semiconductor devices arranged to form a half bridge. Specifically, a semiconductor package according to the present invention includes first semiconductor die 10 (high side) having a first power electrode 12 and a control electrode 14 on a surface thereof and a second power electrode on an opposing surface thereof; second semiconductor die 16 (low side) having a first power electrode 18 and a control electrode 20 on a surface thereof and a second power electrode 19 (see FIG. 4) on an opposing surface thereof; a split conductive pad arrangement including two isolated die pads 22, 24, each being electrically connected to a respective one of the second power electrodes by a conductive adhesive 25, such as solder, conductive epoxy or the like; and a plurality of electrically conductive leads 26, 28, 30, 32, 34 including at least one output lead 30 electrically connected to first electrode 12 of first semiconductor die 10 and second power electrode of second semiconductor die 16.

In the preferred embodiment of the present invention, first semiconductor die 10 and second semiconductor die 16 are power MOSFETs. Thus, in the preferred embodiment of the present invention first power electrodes 12, 18 are source electrodes, second power electrodes are drain electrodes and control electrodes 14, 20 are gate electrodes. Alternatively other power semiconductor switches such as IGBTs, SCRs, III-nitride based devices, such as vertical conduction type high electron mobility transistors, or non-switching devices such as diodes are within the scope of the present invention.

Further, in the preferred embodiment, output lead 30 is integral with die pad 22, meaning that output lead 30 and die pad 22 form a unitary body. In addition, lead 34 and die pad 24 are preferably integral meaning that lead 34 and die pad 24 form a unitary body. Alternatively, output lead 30 may be isolated from die pad 22 and electrically connected to the same by one or a plurality of wirebonds. Also, lead 34 may be isolated from die pad 24 and electrically connected to the same by one or plurality of wirebonds. The wirebonds are preferably 5 mil diameter aluminum wirebonds. Gold or copper wirebonds as well as aluminum ribbon bonds may be used without deviating from the present invention.

In the preferred embodiment, leads 26, 28, 32 are isolated from die pads 22, 24. Each of these leads includes a bonding pad portion 36. Bonding pads 36 are configured for bonding with a wirebond. In the preferred embodiment, bonding pads 36 include a nickel plated portion to facilitate aluminum wirebonding. Alternatively, bonding pads 36 could include a silver, nickel silver, nickel gold portion to facilitate gold wirebonding. Thus, bonding pad 36 of lead 26 is electrically connected to power electrode 18 of die 16 by at least one wirebond 38, bonding pad 36 of lead 28 is electrically connected to control electrode of die 16 by at least one wirebond 38, and bonding pad 36 of lead 32 is electrically connected to control electrode 14 of die 10 by at least one wirebond 38. It should be noted that output lead 36 also includes a wirebond pad 36, which is electrically connected to first power electrode 12 of die 10 by a wirebond 38.

In the preferred embodiment of the present invention, die pads 22, 24, and leads 26, 28, 30, 32, 34 constitute the lead frame of the package and are preferably formed from copper, a copper alloy, or other suitable materials known in the art for lead frame construction such as Kovar.

Referring next to FIG. 4, a semiconductor package according to the present invention further includes molded housing 40 made from any suitable mold compound, which encapsulates at least die 10, 16, a portion of die pads 22, 24 and bonding pads 36 and wirebonds 38. Thus, in the embodiment illustrated by FIG. 4, molded housing 40 encapsulates all of die pads 22, 24. Alternatively, the bottom portions of die pads 22, 24 can be left exposed for better thermal coupling to a heatsink or the like, and/or end portions 42 of die pads 22, 24 can be left exposed and shaped to form a mounting hole 44 to receive a mounting screw or the like in order to mount the package on a support body.

A package according to the present invention may be configured to have a TO-220 outline or a TO-247 outline.

Moreover, a package according to the present invention may be configured to include additional semiconductor devices. For example, IGBT devices may be used in conjunction with anti-parallel diodes each disposed on a respective die pad. Such a package may be configured to have a TO-247 outline. Alternatively, IGBT devices with integrated anti-parallel diodes may be used.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device package comprising:
    a first semiconductor die having a first power electrode and a control electrode on a surface thereof and a second power electrode on an opposing surface thereof;
    a second semiconductor die having a first power electrode and a control electrode on a surface thereof and a second power electrode on an opposing surface thereof;
    a split conductive pad including two isolated die pads, each being electrically connected to a respective one of said second power electrodes;
    a plurality of leads that includes all electrical leads of the package, each lead of the plurality of leads extending from one side of the package and including at least one output lead electrically connected to said first electrode of said first semiconductor die and said second electrode of said second semiconductor die; and
    a housing enclosing said first die and said second die and at least portions of said isolated pads, wherein each said die pad includes a portion that extends to the exterior of said housing, said portions being isolated and spaced from one another.

2. A package according to claim 1, wherein said housing is comprised of a mold compound encapsulating at least said first die and said second die, at least a portion of each of said die pads and wirebonds.

3. A package according to claim 1, wherein said output lead is integral with die pad that is electrically connected to said second power electrode of said second semiconductor die.

4. A package according to claim 1, wherein said plurality of leads includes at least two control leads and two power electrodes, said each control lead being electrically connected to a respective control electrode, a first one of said power leads being electrically connected to said first power electrode of said second semiconductor die and the other one of said power leads being electrically connected to said second power electrode of first semiconductor die.

5. A package according to claim 1, wherein each of said plurality of leads includes a bond pad configured for wirebonding.

6. A package according to claim 5, wherein said bond pads are nickel plated, or nickel silver plated, or nickel gold plated, or sliver plated.

7. A package according to claim 4, wherein the other one of said power leads is integral with said die pad that is electrically connected to said second power electrode of said first semiconductor die.

8. A package according to claim 1, wherein said first semiconductor die and said second semiconductor die are power MOSFETs.

9. A package according to claim 1, wherein said portion of said die pads that extend to said exterior of said housing are configured to receive a mounting element for mounting said package onto a support surface.

10. A package according to claim 1, wherein said first semiconductor die and said second semiconductor die are IGBTs with integrated anti-parallel diodes.

11. A package according to claim 1, wherein said first semiconductor die and said second semiconductor die are IGBTs.

12. A package according to claim 11, further comprising anti-parallel diodes on said die pads.

13. A package according to claim 12, wherein said package is configured to have a TO-247 outline.

14. A package according to claim 1, wherein said package is configured to have a TO-220 outline.

15. A package according to claim 1, wherein said package is configured to have a TO-247 outline.

16. A package according to claim 1, wherein said first semiconductor die and said second semiconductor die are SCRs, or III-nitride power semiconductor devices, or diodes.

* * * * *